METHOD OF MANUFACTURING SEMICONDUCTOR DEVICES

Filed July 27, 1966

INVENTORS
SHOJI TAUCHI
ICHIRO MIWA
MAKOTO HOMMA

BY Paul M. Craig, Jr.
ATTORNEY

United States Patent Office 3,707,410

Patented Dec. 26, 1972

3,707,410

METHOD OF MANUFACTURING SEMICONDUCTOR DEVICES

Shoji Tauchi, Kokubunji-shi, Ichiro Miwa, Kodaira-shi, and Makoto Homma, Chiba-shi, Japan, assignors to Hitachi, Ltd., Tokyo, Japan Filed July 27, 1966, Ser. No. 568,310

Claims priority, application Japan, July 30, 1965, 40/45,906

Int. Cl. H01l 7/44

U.S. Cl. 148—187 11 Claims

ABSTRACT OF THE DISCLOSURE

Method of manufacture of semiconductor devices having a planar surface including introducing a first impurity through a mask into a substrate to form a first doped area and introducing a second impurity through the mask into a selected portion of the substrate to a depth greater than the depth of the first doped area so as to underlie said area, said second impurity having a diffusion constant which is greater than that of said first impurity in the substrate.

The present invention relates to a method of manufacturing semiconductor devices and more particularly to a method of selectively doping a semiconductor with impurities, and still more particularly, to a method of doping a semiconductor through the same surface thereof with a plurality of impurities.

In general, semiconductor devices such as transistors or diodes are formed by a junction between semiconductor layers each having a conductivity type which is reverse to each other, i.e. by a p-n junction, or by a junction between semiconductor layers of different conductivity types, i.e. by pi, ni, $p^+$ $p^-$ or $n^+$ $n^-$ junction, or by their combined junction structure. The aforesaid n- or p-type semiconductor layer is produced in general by introducing a donor or acceptor impurity into the semiconductor or, in other words, by means of alloy, diffusion or growth technique or their combination.

In the practical manufacture of semiconductor devices such as transistors, it has been the general practice, from the aspects of electrical characteristics and purposes of the products, to restrict the doping to only a selected portion of the semiconductor and to adopt the selective multi-doping method which is to introduce different impurities successively through the same surface into a substrate. A typical semiconductor device prepared by such a selective multi-doping method is the planar type transistor which is shown in FIG. 1.

The conventional method of manufacturing a planar type transistor such as shown in FIG. 1 will be briefly described. As a first step, a silicon oxide layer having an opening at a predetermined area on one flat face of an n-type silicon single crystal is formed and then a p-type base region is formed by selectively diffusing a p-type impurity through said opening. Thereafter, a second layer of silicon dioxide is formed on the p-type base region, and an opening is again formed by removing a predetermined portion thereof. An n-type impurity is then selectively diffused through the latter opening to form an n-type emitter region. Subsequently, openings are formed in said silicon dioxide layer so as to reach both the base region and the emitter region. Then, metal layers are formed through said latter openings so as to be in ohmic contact with said respective regions.

It has been the expectation with the planar type transistors thus prepared that particularly stable elements can be obtained because of the fact that the edge portion of the p-n junction is completely protected by the silicon dioxide layer.

However, such conventional method has been found to bear the following defects. As is shown in FIG. 1, a base impurity is first diffused through the opening in the silicon dioxide layer formed over the n-type silicon substrate. In the step of forming an opening in a second layer of silicon dioxide formed on the surface of the silicon substrate for locally diffusing an emitter impurity thereinto, there is involved a step which comprises applying a photoresist film to the entire surface of the silicon dioxide layer and forming an opening in the photoresist film so as to conform to the opening for the diffusion of the emitter impurity.

In this step, wherein a photoresist film is applied to the surface of the silicon substrate, however, it is to be noted that there exists a shouldered portion in the silicon dioxide layer as is shown by the arrow in FIG. 1. Because of the existence of this shouldered portion in the silicon dioxide layer which is encountered in the step of applying a photoresist film, the formed photoresist film tends to have a thickness which is not uniform, and this lack of uniformity in the thickness in turn provides a cause for pinholes to develop at the area of the shoulder. The developed pinholes in the photoresist film permits the etching solution such as HF, which is used to form openings in the silicon dioxide layer for the subsequent emitter diffusion, to pass through the pinholes to come into contact with the layer of silicon dioxide, and thus the pinholes formed in the photoresist film increases the probability that pinholes which may be deep enough to reach the surface of the semiconductor may develop in the silicon dioxide layer. A pinhole located in that particular portion of the silicon dioxide layer overlying the base region would permit the emitter impurity to be diffused farther into the base layer during the subsequent process of diffusion of an emitter impurity, and this will adversely affect the transistor characteristics or the surface characteristics of the completed transistor. The same is true with the process of metal deposition which is conducted to attach electrodes to the emitter and the base regions. In this latter process, the layer of metal such as aluminum which is formed by deposition and the substrate may be short-circuited, and this constitutes a cause for the occurrence of defective units. In view of the fact that the area of the metal layer in a semiconductor integrated circuit in particular is much larger than that in the general planar type transistor, there is a great possibility in the semiconductor integrated circuit for the occurrence of troubles due to a short-circuit between the aluminum deposition film and the semiconductor, which is originated by the fine pinholes developed in the photoresist film and, accordingly, in the silicon dioxide film.

Also, the silicon dioxide mask formed at the time of the diffusion contains a great deal of oxides of impurity atoms and besides this mask is very thin, and therefore, it has a very poor resistance to the etching solution which is used for the formation of an opening for the diffusion of an emitter impurity, and this poor resistance of the mask contributes to an increase in the danger of an occurrence of pinholes. Description has been made on the process of forming, in the previously stated step of selective diffusion, a second silicon dioxide layer on the surface of the semiconductor in the opening which has been formed for the purpose of conducting a selective diffusion. It is, however, difficult to form a second silicon dioxide layer simultaneously with the diffusion in case germanium or other semiconductor materials are used as the semiconductor substrate. As a means of eliminating this difficulty of the conventional method, the formation of a mask layer of silicon dioxide or the like on the semiconductor substrate by the thermal decomposition of a material such as organo-oxy-silane after said diffusion process, has been proposed. This method, however, requires the step of depositing a silicon dioxide layer each time after the completion of a diffusion process, and as a consequence, this method contributes to adding steps and also has an inconvenience in that the electrical characteristics tend to vary due to the fact that impurities are redistributed by heat treatment.

It is, therefore, an object of the present invention to provide a selective multi-doping method which is particularly effective when applied to a planar type transistor and which is also effective in the manufacture of many other types of semiconductor devices.

Another equally important object of the present invention is to eliminate a cause for the occurrence of defective units in the production of semiconductor devices such as transistors and integrated cricuits due to development of pinholes in the aforesaid photoresist film or in the silicon dioxide film which is located beneath said photoresist film, and to provide a novel and very effective method which can be applied to the production of not only silicon but also germanium semiconductor devices or other intermetallic compound semiconductor devices without the requirement of any complicated processes.

Another object of the present invention is to provide a method of manufacturing semiconductor devices which minimizes the probability for defective units to occur.

A further object of the present invention is to provide an improved method of manufacturing reliable semiconductor devices wherein the surface of the semiconductor is protected by an insulator film.

Still another object of the present invention is to provide a novel method of manufacturing planar type semiconductor devices.

The method as well as other objects and advantages of the present invention will become clearer by reading the following detailed description with reference to the accompanying drawings which are given simply by way of example, wherein.

Figure 2:
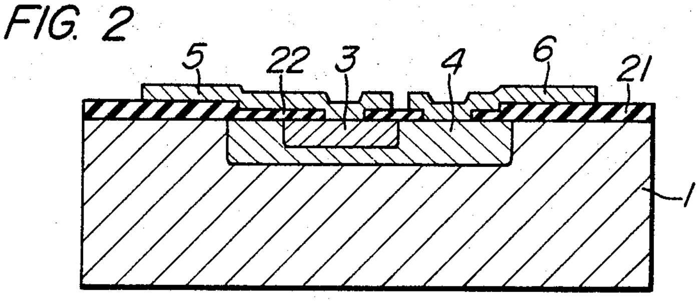
FIG. 2 is a cross sectional view of a planar type transistor manufactured by the method of the present invention.

In the drawings FIG. 2 shows a planar type transistor manufactured according to the method of the present invention, wherein reference numeral 1 represents a semiconductor substrate consisting of, for example, a single crystal of silicon or germanium and having substantially a flat face, and acts as a collector in planar type transistors. Numeral 21 prepresents an insulator film formed on the surface of the substrate, and this film consists usually of silicon dioxide. The insulator film 21 may consist, instead of silicon dioxide, of silicon nitride, aluminum-silicate glass ($Al_2O_3SiO_2$), boron-aluminium-silicate glass ($B_2O_3$—$Al_2O_3$—$SiO_2$) or the like. Numeral 3 represents an emitter region; numeral 4 represents a base region. According to the present invention, prior to the formation of the base region 4, the portion of the substrate where the emitter region 3 is to be formed is heavily doped with an impurity which is of the same conductivity type as that of the substrate 1. Then, an impurity having a conductivity type different from that of the substrate is introduced for the purpose of forming the base region, only to the extent as would not alter the conductivity type of the previously formed emitter region 3, and thus the base region 4 underlying the emitter region 3 is formed. As an impurity to be used in the formation of the base region, a material which has a greater diffusion constant than the impurity used in the formation of the emitter region is selected. As a consequence, the impurity for the base region diffuses past the region containing an emitter impurity.

The impurity of the base region is diffused through the opening formed in the insulator mask layer 21. The p-n junction which is formed between the base diffused region 4 and the collector substrate region 1 extends to the aforesaid flat face and the edge portion thereof is protected permanently by the aforesaid insulator mask layer 21.

Numerals 5 and 6 represent metal layers which are in ohmic contact with the emitter region 3 and the base region 4, respectively. These metal layers are connected to the respective regions through openings formed in the second insulator layer 22 made in the opening previously provided in the mask layer 21 to diffuse the base region impurity.

Description will now be directed to an embodiment of the present invention by referring to FIGS. 3(*a*) to 3(*e*).

FIGS. 3(*a*) to 3(*e*) show the process of manufacturing a semiconductor device wherein the substrate semiconductor consists of silicon. First, as shown in FIG. 3(*a*), an n-type silicon substrate having a resistivity of 0.3 Ω/cm. (which has been doped with phosphorus to a concentration of $3\times10^{16}$ atoms cm.$^{-3}$ is prepared. A silicon dioxide layer 21 is formed on one flat face of this substrate, and the portion of silicon dioxide layer corresponding to the portion where an emitter region is to be formed is removed, and an opening 7 reaching the semiconductor surface is formed. This opening formation is conducted by the use of known photo-engraving technique. The silicon dioxide layer is of a thickness of about 8000 A., which is obtained by heat-treating the silicon substrate in a moisture atmosphere under atmospheric pressure and at 1200° C. for about 45 minutes.

The resulting substrate together with an impurity source is placed in a sealed container which is held under a reduced pressure of $10^{-5}$ mm. Hg. As the impurity source, pulverized silicon containing arsenic in the order of $5\times10^{20}$ atoms cm.$^{-3}$ is prepared. 1 gram of said powder is placed in the vicinity of said substrate enclosed in said container. Then, the container as a whole is heated at 1200° C. for 80 minutes. As a result, a highly doped n-type region 3 which will become the emitter region is formed as is shown in FIG. 3(*b*).

Next, in order to form a base region, an opening 8 which is wider than said opening 7 is formed in the silicon dioxide layer 21, as shown in FIG. 3(*c*). After heating this semiconductor substrate for 10 minutes in an atmosphere containing $N_2$ which is fed at the flow rate of 50 liters/min. and also containing $O_2$ which is fed at the flow rate of 12 liters/min., $N_2$ bubbled through 15 cc. of $BBr_3$ which is held at room temperature is introduced together with $O_2$ to the surface of the semiconductor which is heated at 970° C. and the mixed gas is held there for 35 minutes. Thereafter, the supply of $N_2$ containing said $BBr_3$ is suspended and the substrate is cooled. During this process, boron glass is deposited all over the surface of the semiconductor and the surface of the silicon dioxide layer 21, and a shallow diffusion of boron is made in the semiconductor substrate underlying the opening 8. After removing the layer of boron glass from the said surface, the substrate is heated in a wet $O_2$ atmosphere for 60 minutes so as to diffuse said pre-deposited boron to a further depth. The diffusion velocity of the boron is greater than that of the arsenic, and as a result, boron is diffused deeper than the depth of the highly doped region 3 containing arsenic.

In the semiconductor substrate thus treated is formed a p-type region 4 which underlies the highly doped n-type region 3, as is shown in FIG. 3(*d*). The edge of the p-n junction formed between the p-type region 4 and the n-type substrate 1 reaches said flat face and this edge is protected by the silicon dioxide layer. Furthermore, in said opening 8 is formed a second silicon dioxide layer which covers the semiconductor surface. This second silicon dioxide layer protects the p-n junction which is formed between the n-type region 3 and the p-type region 4. The diffusion depth of the n-type region 3 is about 2μ, and the surface impurity concentration is about $5\times10^{20}$ atoms cm.$^{-3}$. This region serves as an emitter of the transistor, while the p-type region 4 serves as the base and the diffusion depth of this p-type region is about 2.7μ as measured from the surface.

Lastly, openings 9 and 10 reaching the respective emitter and base regions are formed in the second silicon dioxide layer. By providing layers 5 and 6 of metal such as aluminium which are in ohmic contact with the respective regions through said openings 9 and 10, a transistor having the structure shown in FIG. 2 is obtained.

In case germanium is used as the semiconductor substrate, an n-type impurity is diffused much faster in general than is a p-type impurity, in contrast to the case where silicon is used as the substrate. Accordingly, it is appropriate to use p-type germanium as the substrate.

First, a p-type germanium having a specific resistivity of the order of 1Ω is prepared. On one flat surface of this substrate is deposited silicon dioxide fom the vapor phase. For example, by effecting thermal decomposition of tetra-ethoxy-silane at 700° C. for 1.5 hours, a silicon dioxide layer having a thickness of about 8000 A. can be deposited. An opening 7 such as is shown in FIG. 3(*a*) is formed in the predetermined portion of the silicon dioxide layer which has been previously deposited.

Figure 3A:
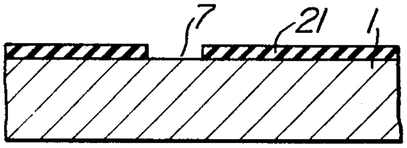
FIGS. 3(*a*) through (*e*) are cross sectional views, illustrative of one embodiment of the method of the present invention.
Figure 3B:
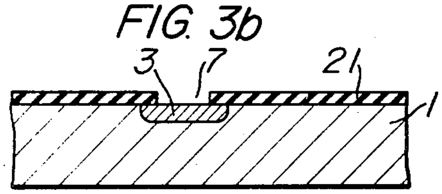
Figure 3C:
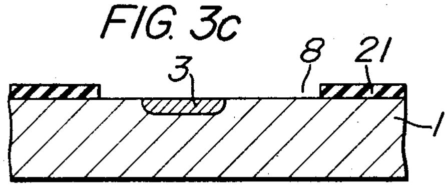
Figure 3D:
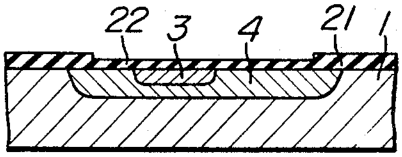
Figure 3E:
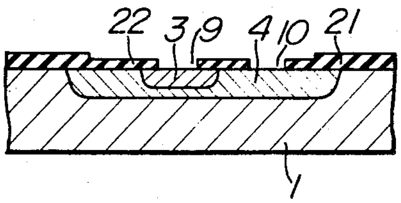

Then, the resulting substrate 1 is heated to 850° C., and is placed in an atmosphere containing vapor of indium for about 23 minutes, with a result that indium is selectively diffused through the opening 7 and a p-type region 3 of a high impurity concentration is formed as is shown in FIG. 3(b). Next, an opening 8 which is wider than the opening 7 is formed in the silicon dioxide layer as is shown in FIG. 3(*c*). The substrate 1 is then held at 750° C. in an atmosphere containing arsenic for 38 minutes. This causes the arsenic to be selectively diffused through the opening 8 to a depth beyond that of the region 3 as is shown in FIG. 3(d), and thus an n-type region 4 is formed.

The p-type region thus obtained has a surface impurity concentration of $10^{19}$ atoms cm.$^{-3}$ and a depth of 1.5μ as measured from the surface, and serves as the emitter of the transistor, while the n-type region 4 has a surface impurity concentration of $10^{18}$ atoms cm.$^{-3}$ and a diffusion depth of 2.5μ and serves as the base region. Accordingly, the width of the base is 1μ. The portion of the p–n junction formed between the collector region 1 and the base region 4 reaching said flat face is completely protected by the silicon dioxide layer 21.

Since a silicon dioxide layer is not formed in the opening during the diffusion process in the case where the substrate consists of germanium, silicon dioxide is deposited by the aforesaid organo-oxy-silane thermal decomposition method to form a silicon dioxide layer 22. Then, openings 9 and 10 reaching the respective regions of the emitter 3 and the base 4 are formed in the silicon dioxide layer 22, as is shown in FIG. 3(*e*). Through these openings are formed metal layers which are in ohmic contact with the respective regions.

Figure 1:
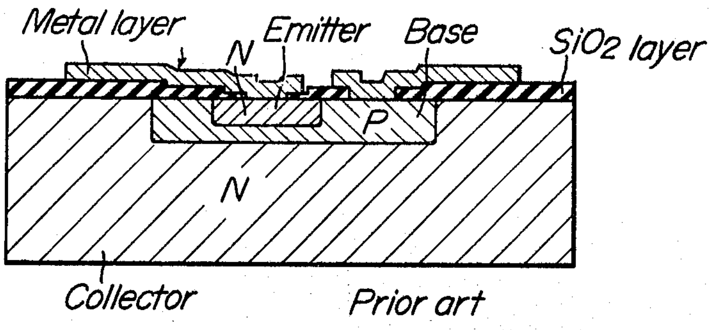
FIG. 1 is a cross sectional view of a planar type transistor manufactured by the conventional method.

In general, it is desirous that the process of the base diffusion be conducted at a temperature lower than that for the emitter diffusion. This will minimize a diffusion of the emitter which may occur during the subsequent base diffusion process, which in turn will minimize a displacement of the emitter-base junction of the transistor during the base diffusion process. The width of the base for determining the frequency of the transistor can be controlled mainly by controlling the depth of the diffusion of the base impurity which is effected subsequently. This markedly enhances the uniformity of the performances of elements. According to the method of the present invention, diffusion is started with the portion having a smaller diffusion area and is proceeded after one another onto the portion having a large diffusion area by the formation of openings, as compared with the aforestated conventional method. As a consequence, in view of the fact that, for example, the shoulder portion in the oxide film located at the position corresponding to the opening formed for the diffusion of the emitter impurity is completely removed by the photo-etching technique prior to the diffusion of the base impurity, as is shown in FIG. 3(*d*), the shoulder of the oxide film in the step of FIG. 3(*d*), in the entire diffusion steps of the present invention, exists only in one position as is the same with the step shown in FIG. 3(*b*). This constitutes an advantage of the present invention in that it minimizes the causes for the occurrence of pinholes in the aforesaid photoresist film as compared with the conventional method of FIG. 1 where there are two shoulders. More specifically, in the case of the conventional method which employs multiple diffusion technique, the same number of shoulders as the number of the diffusions conducted are formed in the mask. In the method of the present invention, however, only one shoulder is formed only at the time of the final diffusion, irrespective of the number or diffusions conducted, and therefore, the present invention has an advantage in that the problem of pinholes due to the existence of the aforesaid shouldered portions during the process of diffusion is completely eliminated. The flat layer of silicon dioxide formed in the final step is retained to the last stage, since it is quite effectively used in the formation of the aforesaid electrodes which is effected by forming an opening or openings in the layer.

As a consequence, unsuccessful diffusion due to such pinholes is minimized. Furthermore, the problem of short-circuit in the substrate semiconductor after aluminium deposition is greatly curtailed. As a consequence, the yield of the planar type transistors or planar type integrated circuits is markedly improved.

While description has been made on the diffusion of only one impurity in the first diffusion step, a plurality of impurities may be diffused either simultaneously or successively through the opening 7, and thereafter an opening 8 may be formed to conduct the second diffusion treatment. Or alternatively, instead of conducting thoroughgoing diffusions at the time of doping in the first and the second diffusion treatments, an impurity may be introduced to a limited extent by either facial deposition, alloy or diffusion technique and, apart from such process, impurities may be later introduced separately into the semiconductor substantially, by the use of a heat treatment employing the diffusion or a suitable technique.

The present invention has been described in detail in connection with an embodiment, but it should be understood that the present invention is not restricted thereto and that various modifications and applications may be made without departing from the spirit and scope of the present invention.

What is claimed is:

1. A method of manufacturing semiconductor devices comprising the steps of: preparing a semiconductor substrate of a first conductivity type having a substantially flat surface; forming a mask layer consisting of an insulator and covering said substantially flat surface; forming a first opening reaching a surface of said substrate in said mask layer; diffusing selectively and with a high concentration a first impurity for determining said first conductivity type through said first opening to form a first semiconductor region; forming in said mask layer a second opening including said first opening and being wider than said first opening; and forming a second semiconductor region in said substrate by introducing through said second opening into said substrate a second impurity which determines a second conductivity type which is different from said first conductivity type and having a diffusion constant greater than said first impurity while located in said substrate, said second impurity being introduced into said substrate to an extent as would not alter the conductivity type of said first semiconductor region which has been formed by the introduction of said first impurity but to an extent as would alter the conductivity type of said substrate, said second semiconductor region underlying said first semiconductor region; and also characterized by the fact that all of the terminals of the p–n junction formed between said semiconductor substrate and second semiconductor region reach said flat surface, and also that said terminals are permanently protected by said mask layer.

2. A method of manufacturing semiconductor devices according to claim 1, characterized by the inclusion of the steps of: forming a protecting layer consisting of an insulator so as to cover the surface exposed in said second opening; forming openings in said protecting layer so as to reach said first and said second semiconductor regions, respectively; and attaching electrodes through said openings to said first and said second semiconductor regions.

3. A method of manufacturing semiconductor devices according to claim 1, characterized by the fact that said semiconductor consists of a single crystal silicon; said mask layer consists of silicon dioxide; said introduction of said second impurity is effected in an oxidizing atmosphere; and that by thus oxidizing the surface of the silicon during the step of introducing said second impurity, an insulator layer consisting of silicon dioxide and covering said exposed surface in said second opening is formed.

4. A method of manufactpring semiconductor devices according to claim 1, characterized by the fact that said semiconductor substrate consists of a single crystal of germanium, and that after the introduction of said second impurity, an insulator layer covering said second opening is formed.

5. A method for manufacturing semiconductor devices comprising the steps of:

preparing a substantially plane surface on a semiconductor substrate;

forming on said surface of said substrate a first insulating film having a first hole extending to said surface;

introducing through said hole into said substrate a first impurity to change the conductivity of the semiconductor selectively;

forming in said film a second hole including said first hole and being wider than said first hole;

introducing through said second hole into said substrate a second impurity having a diffusion constant greater than that of said first impurity in said semiconductor to change the conductivity of the semiconductor, the region including said second impurity underlying the region including said first impurity;

forming a second insulating film to cover said second hole;

preparing on said first and second insulating films a photoresist film having holes exposing the predetermined surface portions of said films; and exposing the combination to an etchant to make in said films holes extending to said surface.

6. A method of manufacturing semiconductor devices comprising the steps of: preparing an n-type silicon substrate having a substantially flat surface; forming on said surface of said substrate an insulating film consisting essentially of silicon oxide and having a first opening extending to said surface of said substrate; introducing arsenic selectively into said substrate through said first opening thereby forming a highly doped n-type region in said substantially flat surface; defining in said insulating film wider than said first opening; introducing boron selectively into said substrate through said second opening so that said boron diffuses to a depth greater than that of said highly doped n-type region thereby to form a p-type region underlying said highly doped n-type region; forming another insulating film to cover said second opening; defining in said another insulating film a third opening and a fourth opening extending to said highly doped n-type region and said p-type region, respectively; and connecting electrodes to said highly doped n-type region and said p-type region through said third and fourth openings, respectively.

7. A method of manufacturing semiconductor devices comprising the steps of: preparing a p-type germanium substrate having a substantially flat surface; forming on said surface of said substrate an insulating film consisting essentially of silicon oxide and having a first opening extending to said surface of said substrate; introducing indium selectively into said substrate through said first opening thereby forming a highly doped p-type region in said substantially flat surface; defining in said insulating film a second opening including said first opening and being wider than said first opening; introducing arsenic selectively into said substrate through said second opening so that said arsenic diffuses to a depth greater than that of said highly doped p-type region thereby forming an n-type region underlying said highly doped p-type region; forming another insulating film to cover said second opening; defining in said another insulating film a third opening and a fourth opening extending to said highly doped p-type region and said n-type region, respectively; and connecting electrodes to said highly doped p-type region and said n-type region through said third and fourth openings, respectively.

8. A method of making a semiconductor device comprising:

forming a mask layer having a first hole exposing a first area on a planar surface of a semiconductor body of one conductivity type, said area being less than the whole area of said surface, diffusing an impurity determining said one conductivity type through said first hole into said first area to produce a first diffused zone, forming in the mask layer a second hole exposing a second area on said surface larger than and including said first area, providing a conductivity type impurity opposite to and having a higher diffusion coefficient than said one conductivity type impurity, and diffusing said opposite conductivity type impurity through said second hole into said second area at a temperature and for a time sufficient to diffuse said opposite conductivity type impurity to a depth greater than the final depth of said first diffused zone.

9. A method of manufacturing semiconductor devices comprising the steps of: preparing an n-type semiconductor substrate having a substantially flat surface; forming on said surface of said substrate an insulating film having a first opening extending to said substrate surface; introducing an n-type impurity selectively into said substrate through said first opening thereby forming a highly doped n-type region in said substantially flat surface; defining in said insulating film a second opening including said first opening and being larger than said first opening; introducing a p-type impurity selectively into said substrate through said second opening so that said p-type impurity diffuses to a depth greater than that of said highly doped n-type region thereby to form a p-type region underlying said highly doped n-type region; forming a second insulating film to cover said second opening; defining in said second insulating film a third opening and a fourth opening extending to said highly doped n-type region and said p-type region, respectively; and connecting electrodes to said highly doped n-type region and said p-type region through said third and fourth openings, respectively.

10. A method of manufacturing semiconductor devices comprising the steps of: preparing a p-type semiconductor substrate having a substantially flat surface; forming on said surface of said substrate an insulating film having a first opening extending to said substrate surface; introducing a p-type impurity selectively into said substrate through said first opening thereby forming a highly doped p-type region in said substantially flat surface; defining in said insulating film a second opening including said first opening and being larger than said first opening; introducing an n-type impurity selectively into said substrate through said second opening so that said n-type impurity diffuses to a depth greater than that of said highly doped p-type region thereby forming an n-type region underlying said highly doped p-type region; forming a second insulating film to cover said second opening; defining in said second insulating film a third opening and a fourth opening extending to said highly doped p-type region and said n-type region, respectively; and connecting electrodes to said highly doped p-type region and said n-type region through said third and fourth openings, respectively.

11. A method of making a semiconductor device according to claim 8, wherein said mask layer consists essentially of silicon dioxide.

References Cited

UNITED STATES PATENTS

| | | | |
|---|---|---|---|
| 2,802,760 | 8/1957 | Derick et al. | 148—187 X |
| 2,861,018 | 11/1958 | Fuller et al. | 148—189 X |
| 2,873,222 | 2/1959 | Derick et al. | 148—187 X |
| 3,122,817 | 3/1964 | Andrus | 148—187 UX |
| 3,210,225 | 10/1965 | Brixey | 148—187 |
| 2,793,145 | 5/1957 | Clarke | 148—190 |
| 3,408,238 | 10/1968 | Sanders | 148—187 |

L. DEWAYNE RUTLEDGE, Primary Examiner

J. M. DAVIS, Assistant Examiner

U.S. Cl. X.R.

148—190; 317—234 R